United States Patent [19]

Botez

[11] Patent Number: 4,581,742
[45] Date of Patent: Apr. 8, 1986

[54] SEMICONDUCTOR LASER HAVING A NON-ABSORBING PASSIVE REGION WITH BEAM GUIDING

[75] Inventor: Dan Botez, Lumberton Township, Burlington County, N.J.

[73] Assignee: RCA Corporation, Princeton, N.J.

[21] Appl. No.: 598,734

[22] Filed: Apr. 10, 1984

[51] Int. Cl.⁴ .............................................. H01S 3/19
[52] U.S. Cl. ..................................... 372/45; 357/17; 372/48
[58] Field of Search ................. 372/44, 45, 46, 50, 372/48, 49; 357/17

[56] References Cited

U.S. PATENT DOCUMENTS

| | | | |
|---|---|---|---|
| 3,701,047 | 10/1972 | Caplan et al. | 331/94.5 |
| 3,753,801 | 8/1973 | Lockwood et al. | 148/171 |
| 3,978,426 | 8/1976 | Logan et al. | 331/94.5 H |
| 3,993,963 | 11/1976 | Logan et al. | 357/18 |
| 4,092,659 | 5/1978 | Ettenberg | 357/18 |
| 4,178,564 | 12/1979 | Ladany et al. | 331/94.5 H |
| 4,215,319 | 7/1980 | Botez | 331/94.5 H |
| 4,297,652 | 10/1981 | Hayashi et al. | 372/50 |
| 4,347,486 | 8/1982 | Botez | 372/46 |
| 4,383,320 | 5/1983 | Botez et al. | 372/45 |
| 4,426,701 | 1/1984 | Botez | 372/45 |
| 4,461,007 | 7/1984 | Burnham et al. | 372/50 |

OTHER PUBLICATIONS

Botez, IEEE Journal of Quantum Electronics, QE-17, 78 (1981).

Primary Examiner—James W. Davie
Attorney, Agent, or Firm—Birgit E. Morris; Donald S. Cohen; William J. Burke

[57] ABSTRACT

A laser comprises a semiconductor body having a pair of end faces and including an active region comprising adjacent active and guide layers which is spaced a distance from the end face and a passive region comprising adjacent non-absorbing guide and mode control layers which extends between the active region and the end face. The combination of the guide and mode control layers provides a weak positive index waveguide in the lateral direction thereby providing lateral mode control in the passive region between the active region and the end face.

24 Claims, 4 Drawing Figures

SEMICONDUCTOR LASER HAVING A NON-ABSORBING PASSIVE REGION WITH BEAM GUIDING

The invention described herein was made in the performance of work under NASA Contract No. NAS 1-17441 and is subject to the provisions of Section 305 of the National Aeronautics and Space Act of 1958 (72 Stat. 435; 42 U.S.C. 2457).

The invention relates to a semiconductor laser and, in particular, to a laser having a non-absorbing passive region with a beam-guiding capability adjacent to an end face.

BACKGROUND OF THE INVENTION

A semiconductor laser comprises a body of material, generally including group III-V compounds or alloys of such compounds, having a thin active region between cladding regions of opposite conductivity type. Double heterostructure lasers, such as those disclosed by Botez in U.S. Pat. No. 4,347,486 and by Connolly et al. in U.S. patent application Ser. No. 367,212 filed Apr. 9, 1982, U.S. Pat. No. 4,461,008, which are incorporated herein by reference, are capable of producing a single transverse (the direction perpendicular to the plane of the layers) and lateral (the direction in the plane of the layers and perpendicular to the direction of light propagation) mode, high power laser beam. These lasers have a guide layer adjacent to the active layer so that light generated in the active layer propagates mostly in the adjacent guide layer, thereby producing a much larger emitting area. However, the emitting area is still small, typically on the order of several square micrometers ($\mu$m). The local power density is thus very high and may result in damage to the emitting end face which can be either catastrophic in nature or a slow, long term end face degradation.

To avoid either type of damage the output power density at the end face is held below the threshold at which such damage occurs. A transparent passivation coating, as disclosed by Ladany et al. in U.S. Pat. No. 4,178,564, incorporated herein by reference, may be placed on the emitting end face to increase the threshold at which the damage occurs. This combination of measures reduces the incidence of damage but the laser's inherent output power capability is not fully utilized.

Catastrophic damage may be caused by local heating of the end face to a temperature close to the melting temperature of the material by absorption of the laser light. To eliminate catastrophic damage and degradation, lasers have been fabricated in which the light absorbing active layer does not extend to the end face with a non-absorbing waveguide between the active layer and the end face, as disclosed, for example, by Botez in U.S. patent application Ser. No. 437,838 filed Oct. 29, 1982, U.S. Pat. No. 4,523,316, and incorporated herein by reference. Such devices have shown an increase in the threshold powers at which the long term and catastrophic damage occur of between about five and ten times.

Such devices do not, however, provide strong lateral mode control in the non-absorbing region adjacent to the emitting end face. Thus, the lateral mode character of the output light beam will depend upon the length of the non-absorbing region which will differ from device to device because of the inaccuracy present in the cleaving process used to form the end faces. Thus, it would be desirable to have a semiconductor laser with a non-absorbing end face and having lateral mode control.

SUMMARY OF THE INVENTION

A semiconductor laser comprises a body having a pair of parallel end faces and including a first cladding region overlying a surface of a substrate. A guide layer which tapers in increasing thickness in the lateral direction overlies the first cladding region and an active layer overlies a portion of the guide layer and is spaced a distance from an end face. A second cladding region overlies the active layer. The combination of the guide and active layers provides an active region with gain. A mode control layer overlies the guide layer adjacent to the end face where the active layer is not present and a burying region overlies the mode control layer. The combination of the guide and mode control layers produces a non-absorbing passive region adjacent to the end face and having a positive index optical waveguide in the lateral direction thereby providing lateral mode control between the active region and the end face.

DETAILED DESCRIPTION OF PREFERRED EMBODIMENTS

In the FIGURES the numerical identification of common elements is the same.

Figure 1:
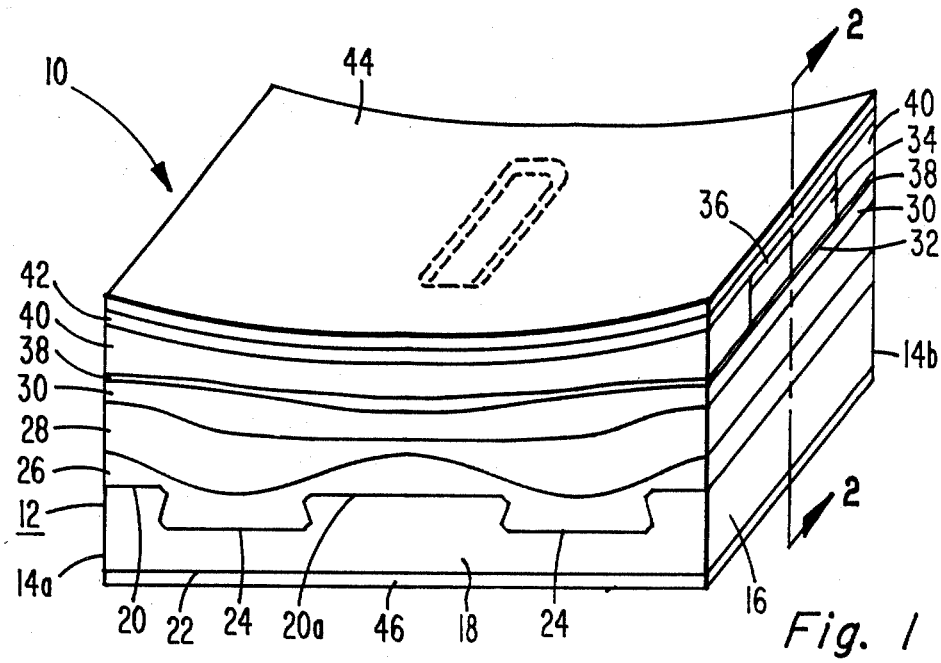
FIG. 1 is a perspective view of a laser of the invention.
Figure 2:
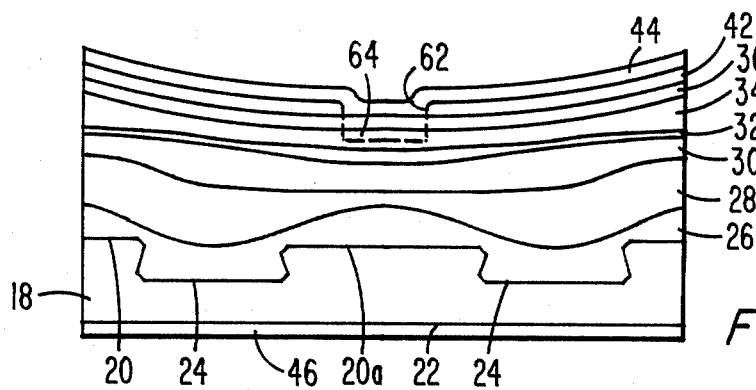
FIG. 2 is a cross-sectional view of the laser of FIG. 1 along the line 2—2.

The laser 10 of FIGS. 1 and 2 comprises a body 12 of semiconductor material in the form of a parallelo-piped having spaced, parallel end faces 14a and 14b which reflect light at the emitting wavelength with at least one of the end faces being partially transparent so that light mmay be emitted therefrom to form a laser cavity and spaced, parallel side surfaces 16 which extend between and are perpendicular to the end faces 14a and 14b.

The body 12 includes a substrate 18 having first and second major surfaces 20 and 22, respectively, and a pair of spaced, substantially parallel channels 24 in the first major surface 20 which extend between the end faces 14a and 14b with a mesa 20a therebetween. The optical axis of the laser cavity is a line extending between the end faces 14a and 14b over the centerline of the mesa 20a. In general, the optical axis is the axis of symmetry of the lasing action.

A buffer layer 26 overlies the first major surface 20, the mesa 20a and partially fills the channels 24. A first cladding region 28 overlies the buffer layer 26 and a guide layer 30 overlies the first cladding region 28. An active layer 32 overlies a portion of the surface of the guide layer 30 extending between the sides surfaces 16 and spaced a distance from the end faces 14a and 14b. A second cladding region 34 overlies the active layer 32 and a cap layer 36 overlies the second cladding region 34. A mode control layer 38 overlies the remainder of the guide layer 30, that is, in those portions not overlaid by the active layer 32, and extends between the active layer 32 and the end faces 14a and 14b. A burying region 40 overlies the mode control layer 38. An electrically insulating layer 42 overlies the cap layer 36 and the burying region 40 and has an opening 62 extending therethrough to the cap layer 36 over the mesa 20a. A high-conductivity, current-confinement zone 64 extends through the cap layer 36 and the second cladding region 34 towards the active layer 32. A first electrical contact 44 overlies the insulating layer 42 and contacts the cap layer 36 in the opening. A second electrical contact 46 overlies the second major surface 22.

Figure 3:
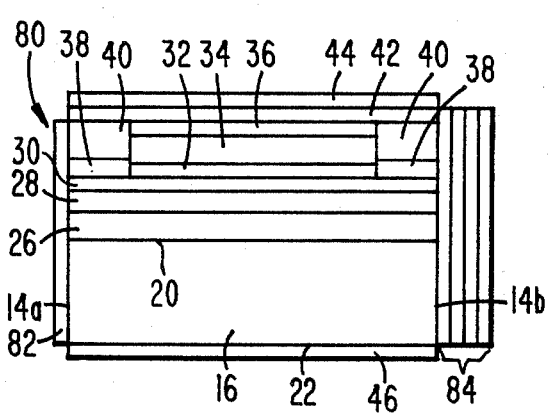
FIG. 3 is a side view of a laser of the invention with end face coatings thereon.

FIG. 3 is a side view of a laser 80 with a light-transmissive coating 82 overlying the end face 14a through which laser light is emitted, as has been disclosed by Ladany et al. in U.S. Pat. No. 4,178,564. A light reflector 84 overlies the opposed end face 14b. Useful light reflectors include a metal as disclosed by Caplan et al. in U.S. Pat. No. 3,701,047 and a multilayer dielectric stack reflector as disclosed by Ettenberg in U.S. Pat. No. 4,092,659, both of which are incorporated herein by reference.

The bulk refractive index at the laser wavelength of the active layer 32 is greater than that of the guide layer 30 which, in turn, is greater than that of the cladding regions 28 and 34 and the burying region 40. The refractive index of the control layer 38 is between that of the first cladding region 28 and the burying region 40 and is preferably different from that of the guide layer 30. The combination of the active and guide layers 32 and 30 together with the cladding regions 28 and 34 constitute an active region which has gain and provides a lateral and transverse optical index guide. The combination of the guide and control layers 30 and 38 together with the first cladding region 28 and the burying region 40 constitute a non-absorbing passive region which provides an optical index guide in the lateral and transverse directions.

The substrate 18, the buffer layer 26, the first cladding region 28 and the guide layer 30 are of one conductivity type. The second cladding region 34 and the cap layer 36 are of opposite conductivity type. The active layer 32 may be of either conductivity type and is typically only lightly conducting. The burying region 40 may be of either conductivity type and typically has a high resistivity which serves to block the flow of electrical current around the active region 32. Alternatively, the burying region 40 may be composed of two layers of opposite conductivity type with a reverse-biased P-N junction therebetween to block the current flow through the burying region 40 when a forward bias is applied to the laser 10.

If the current confinement zone 64 is present it has the same conductivity type as the second cladding region 34. The cap layer 36 may then have either the same or opposite conductivity type to that of the second cladding region 34. If it has the opposite conductivity type, the functions of the cap layer 36 and the insulating layer 42 may be combined, producing a current-blocking, reversed-biased P-N junction except over the mesa 20a when the laser is forward-biased.

The body 12 is composed of binary single-crystal III-V compounds and alloys thereof, such as GaAs and AlGaAs alloys, which are preferably lattice-matched to one another to within 0.5 percent.

The substrate 18 is composed of N-type GaAs having a major surface 20 which may be parallel to or, preferably, misoriented from a {100} crystallographic plane with the axis of the channels oriented parallel to a <110> crystallographic axis. Use of a <110> direction is preferred since the end faces 14a and 14b are then cleavage planes. Preferably, the misorientation angle of the substrate surface with respect to the (001) plane is between about 5° and 45°, and optimally at about 15°. The tilt angle of the (001) plane from the major surface 20 is between about 0.2° and 1.5° and preferably about 0.5°.

The channels 24 are shown as having a dovetail shape which results from the channel axis being parallel to a <110> crystallographic direction. The channels are formed using photolithographic and etching techniques as disclosed by Botez in U.S. Pat. No. 4,215,319, but may have a different shape, for example, a U, Vee or a rectangular shape. The channels 24 are typically between about 4 and 20 $\mu$m wide at the surface 20 and have a depth of about 4 $\mu$m, with a center-to-center spacing typically between about 20 and 45 $\mu$m. The height of the mesa 20a may be different from the height of the major surface 20 above the bottom of the channels 24 as disclosed by Botez in U.S. Pat. No. 4,426,701, incorporated herein by reference. This difference in height is typically between about 0.5 and 3 $\mu$m.

The various layers may be sequentially deposited using well-known liquid-phase epitaxy techniques, such as are described by Botez in U.S. Pat. No. 4,215,319 and by H. F. Lockwood et al. in U.S. Pat. No. 3,753,801, both of which are incorporated herein by reference. In liquid-phase epitaxy the local growth rate of a layer varies with the local curvature of the surface on which it is grown. The greater the amount of local positive curvature of the surface, when viewed from the direction of the overlying layers, the higher the local growth rate will be. For example, the first cladding region 28 may be grown to a thickness such that its surface, upon which the guide layer 30 is deposited, has a local depression over the mesa 20a. The guide layer 30 will then have a higher local growth rate over the convex portions at the corners of this depression. The top surface of the guide layer 30 will have a convex portion centered over the mesa 20a. The growth rate of the active layer 32 or the control layer 38 will be highest over this convex portion. The result is that the guide layer 30 tapers in increasing thickness in the lateral direction from the optical axis while the active and control layers 32 and 38 taper in decreasing thickness in the lateral direction from the optical axis.

The buffer layer 26, if present, is GaAs and is between about 1 and 3 $\mu$m thick over the mesa 20a. The first cladding region 28 is $Al_wGa_{1-w}Al$ where the fractional concentration w of Al is between about 0.25 and about 0.4 and is typically about 0.35 and is typically between about 1 and 3 $\mu$m thick over the mesa 20a. The guide layer 30 is $Al_xGa_{1-x}As$ where the fractional concentration x of Al is less than that of the first cladding region 28 and greater than that in the active layer 32 and is typically between about 0.1 and 0.3 but preferably about 0.15. This layer tapers in increasing thickness from the portion thereof over the centerline of the mesa 20a and has a thickness over the mesa 20a between about 0.5 and about 2 $\mu$m.

The active layer 32 is $Al_yGa_{1-y}As$ where the fractional concentration of y of Al is less than in the guide layer 30 and is typically between about 0 and about 0.07. This layer is typically between about 0.05 and 0.25 $\mu$m thick over the mesa 20a, tapers in decreasing thickness in the lateral direction from the optical axis. This layer typically extends a distance of between about 100 and 200 μm between the faces 14a and 14b and may extend to within between about 10 and 100 μm, and typically to within between about 10 and 100 μm, and typically to within about 50 μm, of an end face.

The second cladding region 34 is $Al_zGa_{1-z}As$ where the fractional concentration z of Al is between about 0.25 and about 0.45 and preferably is about 0.35 and is typically between about 1 and 3 μm thick over the mesa 20a. The cap layer 36 is GaAs and is between about 0.1 and 0.5 μm thick. The burying region 40 is $Al_bGa_{1-b}As$ where the fractional concentration of b of Al is between about 0.2 and 0.4 and is typically about 0.3. The thickness is preferably about equal to the thicknesses of the second cladding region 34 and the cap layer 36.

The mode control layer 38 is non-absorbing at the lasing wavelength and is $Al_mGa_{1-m}As$ where the fractional concentration m of Al is greater than in the active layer 32. The mode control layer 38 together with the guide layer 30 form a weak positive index waveguide produced by the increasing lateral taper of the guide layer 30, the decreasing lateral taper of the control layer 38 and their bulk refractive indices. The Al concentration in the control layer 38 may be greater or less than that of the guide layer 30 and is preferably not the same since the index variation would then depend entirely upon the combined lateral thickness variation of these two layers. The bulk refractive index of the control layer 38 must also be greater than the bulk refractive indices of the first cladding region 28 and the burying region 40. This means that the Al concentration in the control layer 38 must also be less than those of both of these regions. For example, if w=0.35, x=0.15 and b=0.3, then the fractional Al concentration m in the control layer 38 may be between about 0.05 and 0.10 or between about 0.20 and 0.25. This layer is typically between about 0.05 and 1.0 μm thick over the mesa 20a and tapers in decreasing thickness in the lateral direction from the optical axis. The greater the thickness of the control layer 38, the larger the laser spot in the transverse direction will be. Preferably the mode control layer 38 is thicker than the active layer 32 along the optical axis. It is to be understood that the tapers of the active, mode control and guide layers need not be symmetrical about the optical axis in the lateral direction.

The active layer 32, the second cladding region 34 and the cap layer 36 are sequentially deposited over the entire surface of the guide layer 30 using liquid-phase epitaxy. Portions of these layers adjacent one or both of the end faces are then removed by masking and selective chemical etching. The GaAs cap layer 36 may be removed using an etchant such as: 1 $H_2SO_4$:8 $H_2O_2$:8 $H_2O$ or 20 $H_2O_2$:1 $NH_4OH$ at 20° C. for about 15 seconds. The AlGaAs second cladding region 34 may be removed using as an etchant either 1 HF:1 $H_2O$ or 1 HCL:1 $H_2O$. The relative concentrations in these chemical formulae are concentrations by volume. The active layer 32 is preferably removed by melt-etching by exposure to an $Al_cGa_{1-c}As$ solution where c is about 0.30 and increasing the temperature above the solution saturation temperature by between 0.5° and 2° C. The solution is then undersaturated which causes the active layer to dissolve. This technique is preferred since it improves the nucleation during the regrowth of the mode control layer 38. Alternatively, the $Al_yGa_{1-y}As$ active layer 32 where y is less than about 0.07, may be removed using as an etchant 20 $H_2O_2$:1 $NH_4OH$. The control layer 38 and the burying region 40 are grown using standard liquid-phase epitaxy techniques. The masking layer is then removed and the insulating layer 42 is deposited onto the cap layer 36 and the burying region 40 by pyrolytic decomposition of silane in oxygen or water vapor.

The opening 60 preferably only extends over the cap layer 36 and is formed through the insulating layer 42 using standard photolithographic masking techniques and etching processes.

The first electrical contact 44 is composed of titanium, platinum and gold deposited by vacuum evaporation. The electrical contact 44 may be formed by vacuum deposition and sintering and gold, germanium and nickel.

Lateral confinement of a propagating laser beam is produced by an effective transverse refractive index variation arising from the laterally varying thicknesses and the different bulk refractive indices of the different layers as disclosed, for example, by Botez in the IEEE Journal of Quantum Electronics, QE-17, 78 (1981). In the active region where the active layer overlies the guide layer a W-shaped waveguide over the mesa is formed by the combination of a higher index active layer which decreases in thickness in the lateral direction and the guide layer which increases in thickness in the lateral direction. This index guide which confines the propagating laser beam in the lateral direction in the active region.

Botez in U.S. patent application Ser. No. 437,838 has disclosed a laser including a passive region adjacent the emitting end face which includes only a guide layer which tapers in increasing thickness in the lateral direction. This structure produces an anti-guide or negative-index waveguide without gain, i.e., the transverse effective refractive index only increases in the lateral direction, which is leaky and permits the propagating beam to disperse. The mode control layer of the present invention together with the guide layer produces a positive index guide which confines the propagating beam in the lateral direction over the mesa in the passive region and strongly reduces the leakage loss.

While the invention has been described in terms of lateral tapers of the active, guide and mode control layers induced by growth over a pair of channels, it is to be understood that the invention includes any laser having the required lateral tapers without regard to the means used to obtain the taper. It is also to be understood that the invention includes laser arrays of lasing elements, whether coupled or uncoupled, which include a non-absorbing passive region with the required lateral tapers of the layers in one or more of the elements.

The invention is illustrated by the following Example but is not limited to the details described therein.

EXAMPLE

A semiconductor laser incorporating the principles of the invention was fabricated by sequential liquid-phase epitaxy deposition onto the surface of an N+-GaAs substrate wafer having a pair of dovetail-shaped channels with a 32 μm center-to-center spacing, a 12 μm width and a 3.8 μm depth. The deposited layers were an N-type $Al_{0.30}Ga_{0.70}As$ first cladding region 2.1 μm thick; an N-type $Al_{0.19}Ga_{0.81}As$ guide layer 1.2 μm thick; an N-type GaAs active layer 0.16 μm thick; a P-type $Al_{0.30}Ga_{0.70}As$ second cladding region 1.2 μm thick and a 0.67 μm P+-type GaAs cap layer. The thicknesses are those over the center of the mesa between the channels. An etch-resistant $SiO_2$ mask layer was deposited on the cap layer and 50 μm wide openings with 300 μm center-to-center spacing transverse to the channel axis were formed therein. The exposed cap layer and second cladding regions were removed by chemical etching and the wafer re-inserted into the deposition apparatus. The GaAs active layer was removed by melt-etching and a ν-type $Al_{0.20}Ga_{0.80}As$ mode control layer 0.8 μm thick, a ν-type $Al_{0.30}Ga_{0.70}As$ burying region 1.1 μm thick and a $P^+$-type GaAs cap layer 0.45 μm thick were deposited on the guide layer in the openings.

The etch mask was stripped and a 0.1 μm thick $SiO_2$ layer having a 10 μm wide opening therethrough down to the cap layer was formed. A titanium-platinum-gold metal contact was deposited on the $SiO_2$ and the cap layer. A gold-germanium-nickel contact was made to the substrate. Individual laser chips were formed from the substrate wafter by cleaving through the burying region.

Figure 4:
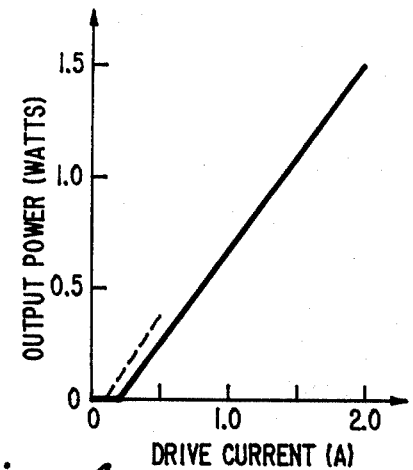
FIG. 4 is a graphical illustration of the output power versus drive current for a laser incorporating the passive region of the invention and a laser without this region.

A maximum output power of about 1.5 watts was obtained with 100 nanosecond pulses at a 1 kHz rate which is about four times more power than for devices of this type without the passive region. The solid curve in FIG. 4 shows the output power for a laser incorporating the mode control layer in the passive region while the broken curve shows the output power for a laser without the passive region. This maximum power is estimated to correspond to a catastrophic-bulk-damage power density threshold of $2-3\times10^7$ W/cm$^2$. Similar power levels at 100-ns pulsed operation have been previously reported for lasers with a non-absorbing end face, but for non-mode-stabilized lasers of 15–20 μm-wide near-field spots. The linear power density at the emitting end face was between 150 and 200 milliwatts/μm, which is 2 to 3 times larger than for prior art devices having a non-absorbing passive region. We believe the main reason for this difference is the large transverse spot size in the passive regions, as evidenced by the very narrow transverse angular beamwidth angle of 15°. Fundamental mode operation is obtained to 80 milliwatts in an angular beamwidth of 7°.

I claim:

1. A semiconductor laser comprising:
   a body of material having a pair of opposed end faces which are reflective of light, at least one of which is partially transmissive of light to form a laser cavity having an optical axis extending between the end faces, said body including:
   a substrate having first and second opposed major surfaces;
   a first cladding region overlying said first major surface;
   a guide layer overlying the first cladding region and tapering in increasing thickness in the lateral direction from the optical axis;
   an active layer which tapers in decreasing thickness from the optical axis overlying a portion of the guide layer and spaced a distance from a first end face;
   a second cladding region overlying the active layer;
   a non-absorbing mode control layer which tapers in decreasing thickness in the lateral direction from the optical axis overlying the guide layer and extending between the active layer and said first end face;
   a burying region overlying the mode control layer; and
   first and second electrical contacts overlying said second cladding region and said second major surface respectively.

2. The laser of claim 1 wherein the active layer has a larger refractive index than the guide layer and the guide layer has a larger refractive index than the first and second cladding regions and the burying region.

3. The laser of claim 2 wherein the refractive index of the mode control layer is different from that of the guide layer.

4. The laser of claim 3 wherein the refractive index of the mode control layer is less than that of the guide layer.

5. The laser of claim 3 wherein the refractive index of the mode control layer is greater than that of the guide layer.

6. The laser of claim 3 wherein a cap layer overlies the second cladding region and an electrically insulating layer having an opening therethrough, overlies the cap layer and the burying region and the first electrical contact overlies the electrically insulating layer and the cap layer in said opening.

7. The laser of claim 6 wherein the substrate and the cap layer are composed of GaAs, the first and second cladding regions, the guide and mode control layers and the burying region are composed of AlGaAs alloys.

8. The laser of claim 1 wherein the active layer is spaced a distance from both of the end faces and the mode control layer extends between the active layer and both end faces.

9. The laser of claim 1 wherein the mode control layer is thicker than the active layer along the optical axis.

10. A semiconductor laser comprising:
    a body of material having a pair of opposed end faces which are reflective of light, at least one of which is partially transmissive of light to form a laser cavity having an optical axis extending between the end faces, said body including:
    a substrate having first and second opposed major surfaces and having a pair of substantially parallel channels extending between the end faces with a mesa therebetween in the first surface;
    a first cladding region overlying said first major surface, the channels and the mesa;
    a guide layer overlying the first cladding region and tapering in increasing thickness in the lateral direction from the optical axis;
    an active layer which tapers in decreasing thickness from the optical axis overlying a portion of the guide layer and spaced a distance from a first end face;
    a second cladding region overlying the active layer;
    a mode control layer which tapers in decreasing thickness in the lateral direction from the optical axis overlying the guide layer and extending between the active layer and said first end face;
    a burying region overlying the mode control layer; and
    first and second electrical contacts overlying said second cladding region and said second major surface respectively.

11. The laser of claim 10 wherein the optical axis is over the center of the mesa.

12. The laser of claim 11 wherein the active layer has a larger refractive index than the guide layer and the guide layer has a larger refractive index than the first and second cladding regions and the burying region.

13. The laser of claim 12 wherein the refractive index of the mode control layer is different from that of the guide layer.

14. The laser of claim 13 wherein the refractive index of the mode control layer is less than that of the guide layer.

15. The laser of claim 13 wherein the refractive index of the mode control layer is greater than that of the guide layer.

16. The laser of claim 13 wherein a cap layer overlies the second cladding region and an electrically insulating layer having an opening therethrough, overlies the cap layer and the burying region and the first electrical contact overlies the electrically insulating layer and the cap layer in said opening.

17. The laser of claim 16 wherein the substrate and the cap layer are composed of GaAs, the first and second cladding regions, the guide and mode control layers and the burying region are composed of AlGaAs alloys.

18. The laser of claim 11 wherein the active layer is spaced a distance from both of the end faces and the mode control layer extends between the active layer and both end faces.

19. The laser of claim 10 wherein the mode control layer is thicker than the active layer along the optical axis.

20. A semiconductor laser comprising:
a body of material having a pair of opposed end faces which are reflective of light, at least one of which is partially transmissive of light to form a laser cavity having an optical axis extending between the end faces, said body including:
a substrate having first and second opposed major surfaces;
a first cladding region overlying said first major surface;
a guide layer overlying the first cladding region;
an active layer overlying a portion of the guide layer and spaced a distance from a first end face;
a second cladding region overlying the active layer;
a mode control layer, which is nonabsorbing at wavelength of the emitted laser light, overlying the guide layer and extending between the active layer and said first end face;
a burying region overlying the mode control layer; and
first and second electrical contacts overlying said second cladding region and said second major surface respectively
wherein the active layer has a larger refractive index than the guide layer and the guide layer has a larger refractive index than the first and second cladding regions and the burying region; and
wherein the refractive index of the mode control layer is different from that of the guide layer and is larger than the refractive indices of the cladding regions and the burying region.

21. The laser of claim 20 wherein the refractive index of the mode control layer is less than that of the guide layer.

22. The laser of claim 21 wherein the first and second cladding regions, the guide and mode control layers and the burying region are composed of AlGaAs alloys with the aluminum concentration in the mode control layer being greater than the aluminum concentration in the guide layer.

23. The laser of claim 20 wherein the refractive index of the mode control layer is greater than that of the guide layer.

24. The laser of claim 23 wherein the first and second cladding regions, the guide and mode control layers and the burying regions are composed of AlGaAs alloys with the aluminum concentration in the mode control layer being less than the aluminum concentration in the guide layer.

* * * * *